United States Patent
Hiraoka et al.

(10) Patent No.: US 10,903,400 B2
(45) Date of Patent: Jan. 26, 2021

(54) LIGHT EMITTING DEVICE AND LIGHT SOURCE DEVICE

(71) Applicant: NICHIA CORPORATION, Anan (JP)

(72) Inventors: Daigo Hiraoka, Tokushima (JP); Takeaki Shirase, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/290,229

(22) Filed: Mar. 1, 2019

(65) Prior Publication Data

US 2019/0280167 A1 Sep. 12, 2019

(30) Foreign Application Priority Data

Mar. 6, 2018 (JP) ................................ 2018-039330

(51) Int. Cl.
| | |
|---|---|
| *H01L 33/50* | (2010.01) |
| *H01L 33/56* | (2010.01) |
| *H01L 33/52* | (2010.01) |
| *H01L 33/60* | (2010.01) |

(52) U.S. Cl.
CPC .......... *H01L 33/504* (2013.01); *H01L 33/501* (2013.01); *H01L 33/502* (2013.01); *H01L 33/56* (2013.01); *H01L 33/60* (2013.01)

(58) Field of Classification Search
CPC ..... H01L 33/501–508; H01L 33/52–62; H01L 33/005; H01L 33/20; H01L 33/22; H01L 33/48; H01L 33/483; H01L 33/486
See application file for complete search history.

(56) References Cited

U.S. PATENT DOCUMENTS

| | | | | |
|---|---|---|---|---|
| 5,556,694 | A * | 9/1996 | Austin | G06F 3/045 428/212 |
| 6,942,932 | B2 * | 9/2005 | Miura | C09K 11/576 252/301.4 S |
| 7,600,882 | B1 * | 10/2009 | Morejon | F21V 3/00 362/84 |
| 7,633,217 | B2 * | 12/2009 | Sakata | C09K 11/7774 313/501 |
| 7,723,740 | B2 * | 5/2010 | Takashima | C09K 11/0883 257/98 |

(Continued)

FOREIGN PATENT DOCUMENTS

| | | |
|---|---|---|
| JP | 2006-070076 A | 3/2006 |
| JP | 2006-309209 A | 11/2006 |

(Continued)

*Primary Examiner* — Maliheh Malek
(74) *Attorney, Agent, or Firm* — Global IP Counselors, LLP

(57) ABSTRACT

A light emitting device includes a first light emitting element and a first covering member. The first light emitting element has a peak emission wavelength in a range of 430 nm or greater and less than 490 nm. The first covering member covers the first light emitting element, and contains a first phosphor having a peak emission wavelength in a range of 490 nm and 570 nm or less. A content of the first phosphor is 50 weight % or greater with respect to a total weight of the first covering member. A mixed color light in which light emitted from the first light emitting element and light emitted from the first phosphor are mixed has an excitation purity of 60% or greater on a 1931CIE chromaticity diagram. The first phosphor contains secondary particles.

14 Claims, 7 Drawing Sheets

(56) References Cited

U.S. PATENT DOCUMENTS

| Patent/Publication | Date | Inventor | Classification |
|---|---|---|---|
| 7,804,103 B1* | 9/2010 | Zhai | H01L 33/504 257/79 |
| 7,828,460 B2* | 11/2010 | Van De Ven | F21V 7/041 362/231 |
| 8,546,841 B2* | 10/2013 | Matoba | H01L 33/486 257/99 |
| 8,703,511 B2* | 4/2014 | Matoba | H01L 33/486 438/26 |
| 9,755,123 B2* | 9/2017 | Ukawa | H01L 33/44 |
| 9,921,428 B2* | 3/2018 | Van De Ven | G02B 6/0078 |
| 10,068,821 B2* | 9/2018 | Shirase | H01L 23/293 |
| 10,249,801 B2* | 4/2019 | Oh | C09K 11/7734 |
| 10,677,399 B2* | 6/2020 | Petluri | F21K 9/64 |
| 10,697,595 B2* | 6/2020 | Petluri | F21K 9/64 |
| 2003/0071936 A1* | 4/2003 | Niiyama | G09G 3/3629 349/73 |
| 2003/0080341 A1* | 5/2003 | Sakano | H01L 33/54 257/79 |
| 2004/0012027 A1* | 1/2004 | Keller | H01L 33/50 257/79 |
| 2004/0032204 A1* | 2/2004 | Wang | C09K 11/7734 313/503 |
| 2005/0200271 A1* | 9/2005 | Juestel | C09K 11/7718 313/503 |
| 2005/0211991 A1* | 9/2005 | Mori | H01L 33/501 257/79 |
| 2006/0145123 A1* | 7/2006 | Li | C09K 11/7734 252/301.4 F |
| 2006/0214562 A1* | 9/2006 | Chang | C09K 11/7774 313/503 |
| 2006/0226759 A1* | 10/2006 | Masuda | C09K 11/0883 313/486 |
| 2006/0261742 A1* | 11/2006 | Ng | H05B 45/37 315/86 |
| 2007/0139920 A1* | 6/2007 | Van De Ven | F21K 9/00 362/235 |
| 2007/0278930 A1* | 12/2007 | Takahashi | C04B 35/597 313/485 |
| 2008/0089053 A1* | 4/2008 | Negley | H01L 33/505 362/84 |
| 2008/0106895 A1* | 5/2008 | Van De Ven | F21V 9/62 362/231 |
| 2008/0136313 A1* | 6/2008 | Van De Ven | F21V 9/62 313/500 |
| 2008/0180948 A1* | 7/2008 | Yoon | C09K 11/0883 362/230 |
| 2008/0191609 A1* | 8/2008 | Schmidt | C09K 11/7787 313/503 |
| 2008/0258602 A1* | 10/2008 | Masuda | B82Y 30/00 313/487 |
| 2008/0278940 A1* | 11/2008 | Van De Ven | F21V 9/62 362/231 |
| 2009/0057698 A1* | 3/2009 | Okamura | H01L 33/502 257/98 |
| 2009/0160330 A1* | 6/2009 | Hsu | H01L 25/0753 313/506 |
| 2009/0173957 A1* | 7/2009 | Brunner | C09K 11/7721 257/98 |
| 2009/0184616 A1* | 7/2009 | Van De Ven | H05B 45/20 313/1 |
| 2009/0194740 A1* | 8/2009 | Heo | C09K 11/7734 252/301.6 F |
| 2009/0195143 A1* | 8/2009 | Song | C09K 11/7774 313/503 |
| 2009/0278151 A1* | 11/2009 | Kim | H01L 33/507 257/98 |
| 2009/0296384 A1* | 12/2009 | Van De Ven | H05B 45/37 362/231 |
| 2010/0123155 A1* | 5/2010 | Pickett | B82Y 15/00 257/98 |
| 2010/0142181 A1* | 6/2010 | Schmidt | C04B 35/593 362/84 |
| 2010/0219428 A1* | 9/2010 | Jung | H01L 25/0753 257/89 |
| 2011/0037409 A1* | 2/2011 | Van De Ven | H05B 45/20 315/294 |
| 2011/0103038 A1* | 5/2011 | Song | F21K 9/00 362/84 |
| 2011/0157916 A1* | 6/2011 | Lee | C09K 11/7734 362/613 |
| 2011/0211351 A1* | 9/2011 | Van De Ven | F21V 29/74 362/249.02 |
| 2011/0286210 A1* | 11/2011 | Shiue | F21K 9/00 362/231 |
| 2012/0007130 A1* | 1/2012 | Hoelen | H01L 33/504 257/98 |
| 2012/0025235 A1* | 2/2012 | Van De Ven | F21K 9/232 257/98 |
| 2012/0039064 A1* | 2/2012 | Ooyabu | H01L 33/507 362/84 |
| 2012/0091500 A1* | 4/2012 | Matoba | H01L 33/486 257/99 |
| 2012/0112626 A1* | 5/2012 | Sakuta | H01L 33/504 313/501 |
| 2012/0169215 A1* | 7/2012 | Liu | G02B 5/201 313/504 |
| 2012/0229032 A1* | 9/2012 | Van De Ven | H05B 45/20 315/151 |
| 2012/0256163 A1* | 10/2012 | Yoon | G02F 1/133603 257/13 |
| 2012/0274240 A1* | 11/2012 | Lee | H01L 33/502 315/312 |
| 2012/0305955 A1* | 12/2012 | Hussell | H01L 33/502 257/98 |
| 2013/0009541 A1* | 1/2013 | Zheng | C09K 11/0883 313/503 |
| 2013/0020933 A1* | 1/2013 | Levermore | H01L 27/3213 313/504 |
| 2013/0114241 A1* | 5/2013 | van de Ven | H05B 45/20 362/84 |
| 2013/0264937 A1* | 10/2013 | Sakuta | H05B 33/12 313/503 |
| 2013/0344631 A1* | 12/2013 | Matoba | H01L 33/486 438/26 |
| 2014/0021595 A1* | 1/2014 | Shirase | H01L 23/49513 257/684 |
| 2014/0022779 A1* | 1/2014 | Su | H01L 33/504 257/98 |
| 2014/0055982 A1* | 2/2014 | Tao | C09K 11/7733 362/84 |
| 2014/0145225 A1* | 5/2014 | Wu | H01L 25/0756 257/98 |
| 2014/0183497 A1* | 7/2014 | Shinotsuka | H01L 51/5268 257/40 |
| 2014/0197400 A1* | 7/2014 | Li | H01L 51/5036 257/40 |
| 2014/0339582 A1* | 11/2014 | Matsumura | H01L 33/505 257/98 |
| 2015/0076544 A1* | 3/2015 | Schmidtke | H01L 33/58 257/98 |
| 2015/0097200 A1* | 4/2015 | Bergmann | H01L 33/50 257/89 |
| 2015/0138768 A1* | 5/2015 | Van De Ven | F21V 19/001 362/235 |
| 2015/0322338 A1* | 11/2015 | Yoshida | C09K 11/675 252/301.4 F |
| 2016/0049560 A1* | 2/2016 | Oh | H01L 33/486 257/98 |
| 2016/0079484 A1* | 3/2016 | Hosokawa | H01L 33/502 257/98 |
| 2016/0087177 A1* | 3/2016 | Schwarz | H01L 33/0095 257/98 |
| 2016/0097495 A1* | 4/2016 | Yamamoto | C09K 11/665 349/65 |
| 2016/0126428 A1* | 5/2016 | Hosokawa | H01L 33/502 257/98 |
| 2016/0181482 A1* | 6/2016 | Borrelli | H01L 33/505 257/98 |

(56) References Cited

U.S. PATENT DOCUMENTS

| | | | |
|---|---|---|---|
| 2016/0218254 A1* | 7/2016 | Jacobson | H01L 33/504 |
| 2016/0276549 A1* | 9/2016 | Yamashita | H01L 33/504 |
| 2016/0351757 A1* | 12/2016 | Yoshimura | H01L 33/504 |
| 2016/0365494 A1* | 12/2016 | Ukawa | H01L 33/44 |
| 2016/0366746 A1* | 12/2016 | van de Ven | H05B 45/20 |
| 2016/0375161 A1* | 12/2016 | Hawkins | F21V 23/0442 422/22 |
| 2017/0005243 A1* | 1/2017 | Sajiki | H01L 33/54 |
| 2017/0145309 A1* | 5/2017 | Zhu | H01L 33/641 |
| 2017/0222103 A1* | 8/2017 | Haiberger | H01L 33/504 |
| 2017/0223786 A1* | 8/2017 | Petluri | H05B 45/10 |
| 2017/0223799 A1* | 8/2017 | Petluri | H01L 25/0753 |
| 2017/0236866 A1* | 8/2017 | Lee | H01L 27/156 257/89 |
| 2017/0250316 A1* | 8/2017 | Yeon | H01L 33/50 |
| 2017/0256684 A1* | 9/2017 | Asai | C09K 11/0883 |
| 2017/0279012 A1* | 9/2017 | Yoshimura | H01L 33/502 |
| 2017/0309790 A1* | 10/2017 | Son | H05B 45/20 |
| 2017/0358716 A1* | 12/2017 | Park | H01L 33/486 |
| 2018/0024006 A1* | 1/2018 | Akagawa | H01L 25/0753 257/89 |
| 2018/0077766 A1* | 3/2018 | Sooch | H05B 47/16 |
| 2018/0097152 A1* | 4/2018 | Akagawa | H01L 33/504 |
| 2018/0106675 A1* | 4/2018 | Yao | H05B 47/10 |
| 2018/0171225 A1* | 6/2018 | Justel | C09K 11/7794 |
| 2018/0188592 A1* | 7/2018 | Peng | G02F 1/13394 |
| 2018/0216791 A1* | 8/2018 | Leung | H05B 45/20 |
| 2018/0252374 A1* | 9/2018 | Keller | F21S 8/026 |
| 2018/0259140 A1* | 9/2018 | Keller | H05B 47/19 |
| 2018/0311386 A1* | 11/2018 | Hawkins | F21V 5/04 |
| 2018/0366621 A1* | 12/2018 | Yun | H01L 33/502 |
| 2018/0368218 A1* | 12/2018 | Petluri | H05B 45/20 |
| 2018/0368219 A1* | 12/2018 | Petluri | H01L 33/502 |
| 2019/0013448 A1* | 1/2019 | Nakano | C09K 11/7774 |
| 2019/0029092 A1* | 1/2019 | Petluri | F21K 9/64 |
| 2019/0062632 A1* | 2/2019 | Nishimata | C09K 11/7734 |
| 2019/0148605 A1* | 5/2019 | Mu | H01L 33/50 257/98 |
| 2019/0194062 A1* | 6/2019 | Wolfinger | C03C 1/002 |
| 2019/0198559 A1* | 6/2019 | Miki | H01L 27/15 |
| 2019/0198719 A1* | 6/2019 | Fujioka | H01L 33/502 |
| 2019/0198738 A1* | 6/2019 | Nakabayashi | H01L 33/60 |
| 2019/0237635 A1* | 8/2019 | Yuasa | H01L 33/504 |
| 2019/0237636 A1* | 8/2019 | Oh | C09K 11/616 |
| 2019/0254142 A1* | 8/2019 | Petluri | G09G 3/3413 |
| 2019/0280169 A1* | 9/2019 | Pust | H01L 33/504 |
| 2019/0326484 A1* | 10/2019 | Welch | H01L 33/44 |
| 2019/0338184 A1* | 11/2019 | Nishimata | H01L 33/502 |
| 2019/0341531 A1* | 11/2019 | Zhang | H01L 3/08 |
| 2019/0348576 A1* | 11/2019 | Lai | H01L 33/501 |
| 2020/0079995 A1* | 3/2020 | Suzuki | C01G 37/14 |
| 2020/0091121 A1* | 3/2020 | Yamamoto | H01L 33/508 |
| 2020/0100333 A1* | 3/2020 | Petluri | F21K 9/00 |
| 2020/0133077 A1* | 4/2020 | Lin | G02B 6/0041 |
| 2020/0187325 A1* | 6/2020 | Petluri | H01L 25/167 |
| 2020/0227484 A1* | 7/2020 | Lin | G02F 1/133617 |
| 2020/0260546 A1* | 8/2020 | Petluri | H01L 33/50 |
| 2020/0309347 A1* | 10/2020 | Tudorica | F21V 7/00 |

FOREIGN PATENT DOCUMENTS

| | | |
|---|---|---|
| JP | 2007-081159 A | 3/2007 |
| JP | 2008-285576 A | 11/2008 |
| JP | 2009-515030 A | 4/2009 |
| JP | 2010-254851 A | 11/2010 |
| JP | 2017017159 A | 1/2017 |
| WO | 2012169289 A1 | 12/2012 |
| WO | 2017057454 A1 | 4/2017 |

\* cited by examiner

LIGHT EMITTING DEVICE AND LIGHT SOURCE DEVICE

CROSS-REFERENCE TO RELATED APPLICATIONS

This application claims priority to Japanese Patent Application No. 2018-039330 filed on Mar. 6, 2018. The entire disclosure of Japanese Patent Application No. 2018-039330 is hereby incorporated herein by reference.

The present disclosure relates to a light emitting device and a light source device.

BACKGROUND

Japanese Laid-Open Patent Publication No. 2007-081159 discloses a light emitting device that includes: a light emitting element that emits light having a light emission peak in a wavelength range of 360 nm or greater and less than 480 nm; and a fluorescent substance that absorbs light emitted by the light emitting element and emits green light having alight emission peak in the wavelength range of 500 nm or greater and less than 570 nm, thus substantially emitting only green light.

However, such a light emitting, device, there is the possibility that the light emitting device emits light with insufficient light output or excitation purity.

SUMMARY

In light of that, certain embodiment of the present disclosure provides a light emitting device that emits fight with high light output and excitation purity.

The light emitting device of certain embodiment of the present disclosure comprises a first light emitting element and a first covering member. The first light emitting element has a peak emission wavelength in a range of 430 nm or greater and less than 490 nm. The first covering member covers the first light emitting element, and contains a first phosphor having a peak emission wavelength in a range at 490 nm and 570 nm or less. A content of the first phosphor is 50 weight % or greater with respect to a total weight of the first covering member. A mixed color light in which light emitted from the first light emitting element and light emitted from the first phosphor are mixed has an excitation purity of 60% or greater on a 1931CIE chromaticity diagram. The first phosphor contains secondary particles.

With certain embodiment of the present disclosure, it is possible to provide a light emitting device emitting light with high light output and excitation purity.

DETAIL DESCRIPTION OF EMBODIMENT

A detailed explanation is described based on the drawings. Parts with the same code number that appear in multiple drawings show the same or equivalent parts or members.

Furthermore, this is an item illustrating an example of a light emitting device to give a specific form to the technical concept of the present invention, and the present invention is not hunted to the following. The dimensions, materials, shape, relative placement, etc. of the constitution components, unless specifically noted, do not limit the claims of the present invention only to that, and are intended to illustrate examples. Also, with the explanation hereafter, there are cases of using terminology indicating a specific direction or position (e.g. "up," "down," and other terms including these terms). Those terms are merely used to make it easy to understand the relative direction or position in the referenced drawing. The size, positional relationship, etc. attic members shown in each drawing may be exaggerated for easier understanding, etc. The relationship of color names and chromaticity coordinates, the relationship of the light wavelength range and color names of monochromatic light, etc., comply with JIS Z8110.

Figure 1A:
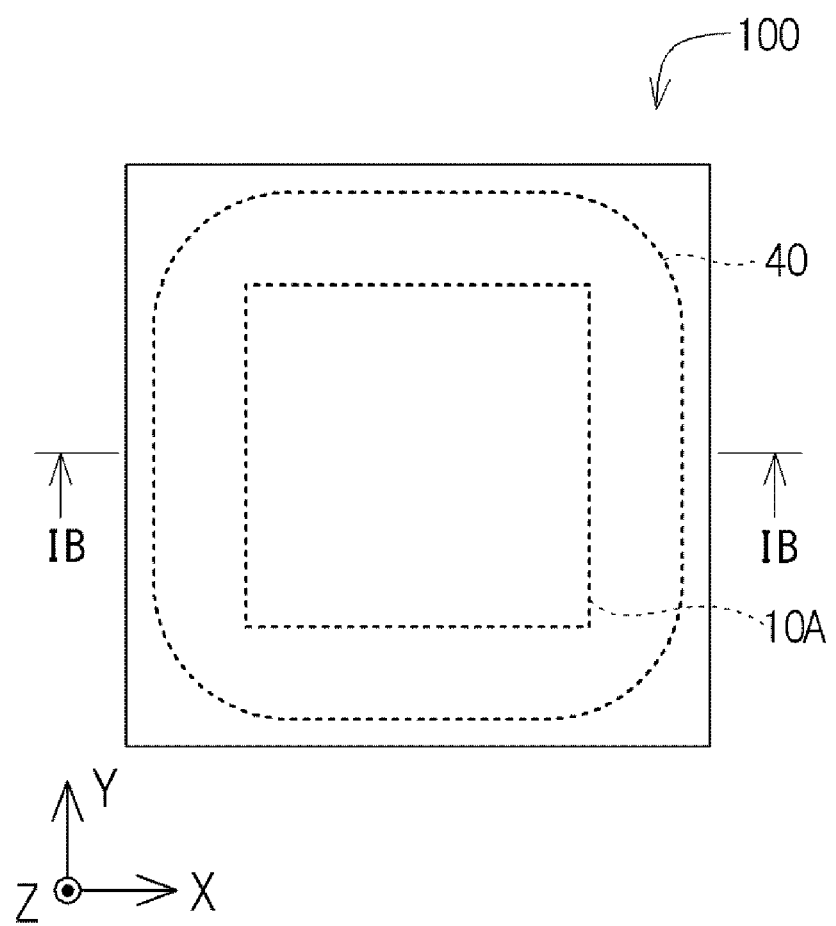
FIG. 1A is a schematic top view of a light emitting device of art embodiment.
Figure 1B:
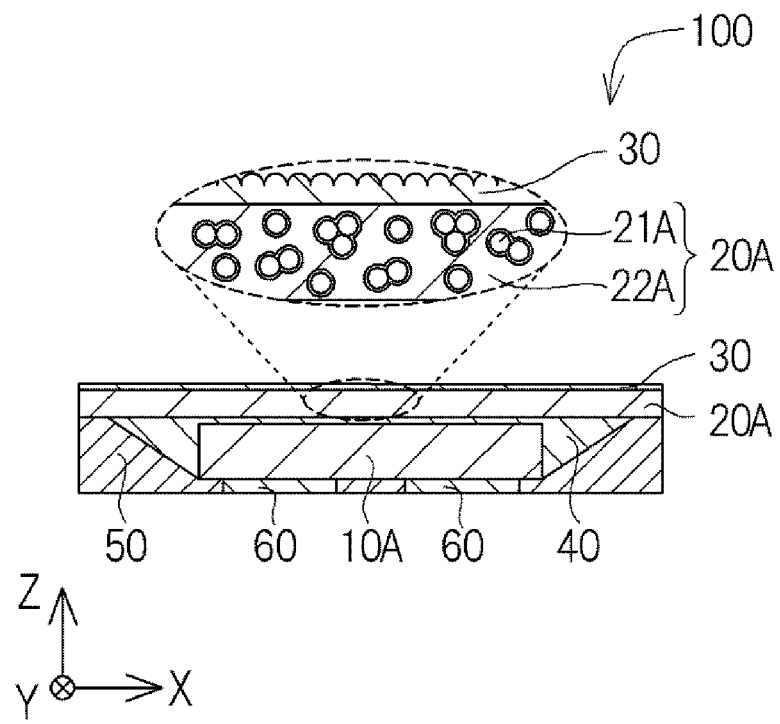
FIG. 1B is a schematic cross section view taken along line IB-IB in FIG. 1A.

FIG. 1A is a schematic top view of a light emitting device 100 of an embodiment, and FIG. 1B is a schematic cross section view of the light emitting device 100.

The light emitting device 100 comprises a first light emitting element 10A, and a first covering member 20A that covers the first light emitting element 10A. The peak emission wavelength of the first light emitting element is in a range of 430 nm or greater and less than 490 nm. The first covering member 20A contains a first phosphor 21A. The peak emission wavelength of the first phosphor 21A is in a range of 490 nm to 570 nm. The first covering member contains the first phosphor of 50 weight % or greater with respect to the total weight, of the first covering member. The mixed light of the light emitted from the first light emitting element and the light emitted from the first phosphor has an excitation purity of 60% or greater on the 1931CIE chromaticity diagram. Also, the first phosphor contains secondary particles. The light emitting device 100 further comprises a light guide member 40, a reflective member 50, an outermost layer 30, and a pair of external connection terminals 60. The light guide member 40 covers the lateral surface of the first light emitting element 10A. The reflective member 50 covers the lateral surface of the first light emitting element with the light guide member 40 interposed. The outermost layer 30 covers the top surface of the first covering member 20A. The pair of external connection terminals 60 is connected to beneath the first light emitting element 10A. The pair of external connection terminals 60 has at least the bottom surface exposed from the reflective member 50.

The light emitting device 100 comprises the first light emitting element 10A emitting light with the peak emission wavelength in the range of 430 nm or greater and less than 490 nm. The first light emitting element 10A emits blue light. The first light emitting element 10A emits light with a peak emission wavelength of a longer wavelength than the near ultraviolet region, so that the constituent members of the light emitting device 100 is less likely to deteriorate.

The light emitting device 100 has one first light emitting element 10A. Also, the first light emitting element 10A has a rectangular outline shape seen in the top view. In the light emitting device 100, the number of and outline shape of the first light emitting element 10A can change according to the purpose or application. For example, the light emitting device can comprise two or more of the first light emitting element, or can comprise the first light emitting element having a hexagonal outline shape seen in the top view.

The light emitting device 100 comprises the first covering member 20A that contains the first phosphor 21A emitting light with the peak emission wavelength in the range of 490 nm to 570 nm. The first covering member 20A covers the first light emitting element 10A. The first covering member 20A is for a member in which the first phosphor 21A is contained in a first base material 22A such as silicone resin.

The first phosphor 21A is a green phosphor that absorbs blue light emitted by the first light emitting element 10A, and emits green light. As the first phosphor 21A, it is preferable to use a phosphor having a composition represented by (Ca, Sr, Ba)$_8$MgSi$_4$O$_{16}$(F, Cl, Br)$_2$:Eu, and particularly preferable to use a phosphor having a composition represented by Ca$_8$MgSi$_4$O$_{16}$Cl$_2$:Eu. The phosphor having a composition of Ca$_8$MgSi$_4$O$_{16}$Cl$_2$:Eu has high absorption efficiency with respect to light emitted by the first light emitting element 10A. This can allow the light emitting device 100 to emit light with less blue component and greater green component. Also, the phosphor having a composition of Ca$_8$MgSi$_4$O$_{16}$Cl$_2$:Eu has a full-width-at-half maximum in the light emission spectrum of 65 am or less, thus the color purity of the light emitting device 100 can be improved.

The content amount of the first phosphor 21A within the first covering member 20A is 50 weight % or greater with respect to the total weight of the first coveting member 20A. By containing, the first phosphor 21A at 50 weight % or greater within the first covering member 20A, the light emitting device 100 can emit light having a spectrum of which the ratio of the green component is greater with respect to the blue component.

Figure 2:
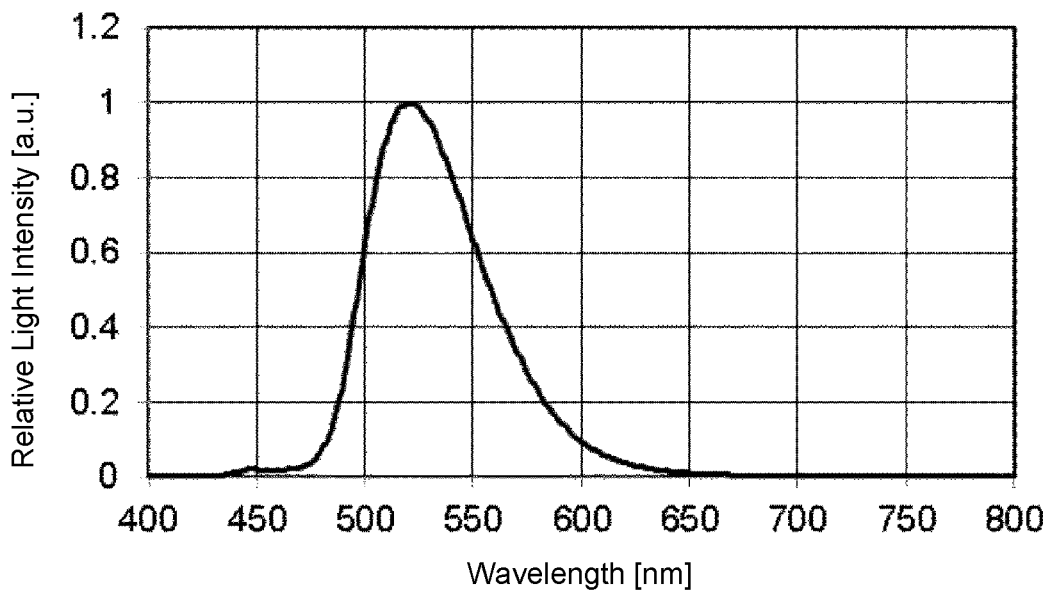
FIG. 2 is a graph showing the light emission spectrum of the light emitting device.

FIG. 2 is a graph showing the light emission spectrum of the light emitting device 100.

The first light emitting element 10A and the first phosphor 21A are configured to have desired light emission peak intensities such that, in the light emission spectrum of the light emitting device 100 shown in FIG. 2, the light emission peak intensity of the first light emitting element 10A is 0.005 times to 0.1 times the light emission peak intensity of the first phosphor 21A. The light emission peak intensity of the first light emitting element 10A is 0.005 times or greater than the light emission peak intensity of the first phosphor 21A, and this can increase the light output of the light emitting device. Also, the light emission peak intensity of the first light emitting element 10A is 0.1 times or less than the light emission peak intensity of the first phosphor 21A, and this can increase the excitation purity of the green light. Also, the light emission peak intensity of the first light emitting element 10A is even more preferably 0.01 times to 0.03 times the light emission peak intensity of the first phosphor 21A. This can make the light output the light emitting device 100 higher, and make the excitation purity of the green light of the light emitting device 100 higher.

The light emitting device 100 is the light emitting device that emits green light using, blue light of the first light emitting element 10A as the light source. Commonly, in the case of employing a nitride-based light emitting element that contains indium in the light omitting layer, the green light emitting element contains indium greater than indium content of the blue light emitting element. This lowers the light output compared to the blue light emitting element. However, the light emitting device 100 of the present disclosure comprises the first light emitting element 10A configured with the blue light emitting element, and the first phosphor 21A having high excitation efficiency with respect to the emission light of the first light emitting element 10A. This can allow the light emitting device 100 to exhibit higher light output compared to the nitride-based green light emitting element.

By containing the first phosphor 21A at 50 weight % or greater within the first covering member 20A, the mixed light of the light emitted from the first light emitting element 10A and the light, emitted from the first phosphor 21A can have excitation purity of 60% or greater on the 1931CIE chromaticity diagram. The excitation purity in this case indicates the chroma of the light emission color. Excitation purity P is expressed in mathematical formula (I) or mathematical formula (II) hereafter, based on a definition that the coordinates of the white point (i.e., achromatic color) are $N(x_n, y_n)$, the chromaticity coordinates of the emitted light (i.e., mixed light) of the light emitting device 100 are $C(x_e, y_e)$, and the coordinates of the intersection point of the straight line extending from coordinate N to coordinate C and the spectrum locus are $D(x_d, y_d)$, on the 1931CIE chromaticity diagram.

Formula I
$$P = \frac{x_c - x_n}{x_d - x_n} \times 100 \ (\%) \quad (I)$$

Formula II
$$P = \frac{y_c - y_n}{y_d - y_n} \times 100 \ (\%) \quad (II)$$

Having the excitation purity P with respect to green light being 60% or greater can improve color reproducibility in the green region of the light source that incorporates the light emitting device 100. The excitation purity P is, for example, preferably 63% or greater, and more preferably 65% or greater.

The content amount of the first phosphor 21A within the first covering member 20A is, for example, preferably 75 weight % or less with respect to the total weight of the first covering member 20A, and more preferably 70 weight % or less.

This can allow the light emitting device 100 to emit light having, a small spike in the blue region in the light emission spectrum of the light emitting device 100 shown in FIG. 2. Then, a portion of the high-light-intensity blue light of the first light emitting element 10A exits to outside, so that the light emitting device 100 can exhibit higher light output. As a result, a light emitting device exhibits even higher light output and higher excitation purity with respect to the green light of the light emitting device 100.

The first phosphor 21A contains secondary particles which are aggregation of the primary particles. In the certain concentration of the first phosphor contained in the first covering member, the first phosphor 21A containing secondary particles can allow the light emitting device to exhibit higher light output and higher excitation purity. For example, in the certain particle diameter of the primary particles of the first phosphor, the first phosphor containing, the secondary particles can realize higher light output of the light emitting device compared to the case where the first phosphor contains only the primary particles. The first phosphor containing the secondary particles can increase the interval between the adjacent first phosphors more than in the case of the first phosphor containing only primary particles. This can all the first phosphor to absorb the light from the first light emitting element, to thereby increase the light output of the light emitting device 100.

Also, in a case when the particle diameter of the primary particles and the particle diameter of the secondary particles are the same, the first phosphor containing secondary particles can exhibit higher excitation purity than that of the first phosphor of only primary particles. The surface area of the secondary particles that are an aggregate can easily be made larger than the surface area of the primary particles. For this reason, the light from the light emitting element is easily diffused by the interface between the first base material and the first phosphor of the first covering member, to thereby increase the excitation purity of the light emitting device higher.

The surface of the phosphor 21A is preferably covered by a light transmissive film. Having the surface of the first phosphor 21A being covered with a translucent film can alleviate deterioration of the first phosphor. An example of the light transmissive film includes a silica film.

The median particle diameter of the first phosphor is preferably 1.5 times to 3 times of the average particle diameter of the first phosphor. In this specification, the average particle diameter of the phosphor is the average value of the particle diameter of primary particles measured using the F.S.S.S. method (Fisher Sub-Sieve Sizer). The F.S.S.S. method can find the average value of the particle diameter of the primary particles by measuring the specific surface area using an air permeability method. The average particle diameter is measured using the Fisher Sub-Sieve Sizer Model 95 produced by Fisher Scientific Co., for example. In this specification, the median particle diameter of the phosphor is the volume average particle diameter (i.e., median diameter) of the primary particles and the secondary particles of the first phosphor, and is the particle diameter for which the volume cumulative frequency from the small diameter side reaches 50% (D50: median diameter). The median particle diameter can be measured using a laser diffraction type particle distribution measuring device (Mastersizer 2000 made by Malvern Co.). The laser diffraction type particle distribution measuring device can measure the particle diameter of primary particles and the particle diameter of secondary particles. The median particle diameter of the first phosphor including the primary particles and the secondary particles is preferably 1.5 times or greater than the average particle diameter of the primary particles of the first phosphor, so that the ratio of the secondary particles contained in the first phosphor increases, to thereby increase the light output of the light emitting device. Also, the median particle diameter of the first phosphor including the primary particles and the secondary particles is preferably 3 times or less than the average particle diameter of the primary particles of the first phosphor, so that the ratio of the primary particles contained in the first phosphor is maintained at a sufficient level, to thereby increase the light from the phosphor excited by the first light emitting element. The first phosphor can have the median particle diameter of the first phosphor including the primary particles and the second particles that is 1.5 times to 3 times of the average particle diameter of the primary particles of the first phosphor, to thereby increase the light output of the light emitting device and the light from the phosphor excited by the first light emitting element.

In addition to the first phosphor, the first covering member 20A may also contain diffusion member with a smaller particle size than the first phosphor such as $SiO_2$, etc., Accordingly, when a plurality of the light emitting devices is manufactured, the manufacturing variation of the chromaticity can be reduced in each light emitting device. The particle shape of the diffusion member is for example, 100 nm or less, and preferably 55 nm or less.

The light emitting device 100 may also comprise the light guide member 40 that covers the lateral surface of the first light emitting element 10A. The light guide member 40 has high transmissivity of light from the first light emitting element than the reflective member described later. For this reason, the light guide member 40 can coat the lateral surface of the first light emitting element, so that the light emitted from the lateral surface of the first light emitting element 10A is easier to extract to outside of the light emitting device through the light guide member 40. As a result, the light output of the light emitting device higher can be increased.

Figure 1C:
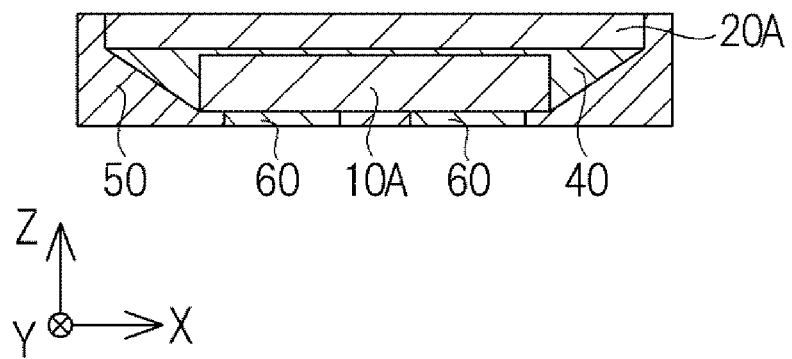
FIG. 1C is a schematic cross section view of a modification example of the light emitting device of the embodiment.

The light emitting device 100 preferably comprises the reflective member 50 that covers the lateral surface of the first light emitting element 10A. The reflective member 50 covering the lateral surface of the first light emitting element can reflect the light travelling in the X direction, and/or the Y direction from the first light emitting element 10A to increase the light travelling in the Z direction. When the light emitting device 100 comprises the light guide member, the reflective member 50 covers the lateral surface of the light emitting element with the light guide member 40 interposed. When the light emitting device 100 comprises the reflective member, the first covering member 20A preferably covers the first light emitting element and the reflective member. Such a configuration can increase the area of the first covering member 20A in the top view, so the light extraction efficiency of the light emitting device can be improved. Also, as shown in FIG. 1C, the reflective member can also cover the lateral surface of the first covering member. Such a configuration can allow a light emitting device to have high contrast between the light emitting region and the non-light emitting region, which is good "distinguish ability."

The light emitting device 100 preferably comprises the outermost layer 30 that covers the top surface of the first covering member 20A. The outermost layer 30 covers the top surface of the first covering member 20A, to thereby alleviate degradation of the first covering member. The top surface of the uppermost layer 30 preferably has recessions and projections. The top surface of the outermost layer having recesses and projections can reduce the contact area between the outermost layer 30 of the light emitting device 100 and a cover tape or suction nozzle. This can alleviate the light emitting device 100 to stick to the cover tape and/or have release lure during mounting. The outermost layer preferably contains a resin which is the base material and a filler. The outermost layer contains the filler, to thereby easily form recesses and projections on the top surface of the outermost layer. The recesses and projections of the top surface of the outermost layer 30 preferably have an arithmetic mean roughness Ra of 1 μm to 5 μm. This arithmetic mean roughness Ra complies with JIS B0601.

Figure 3:
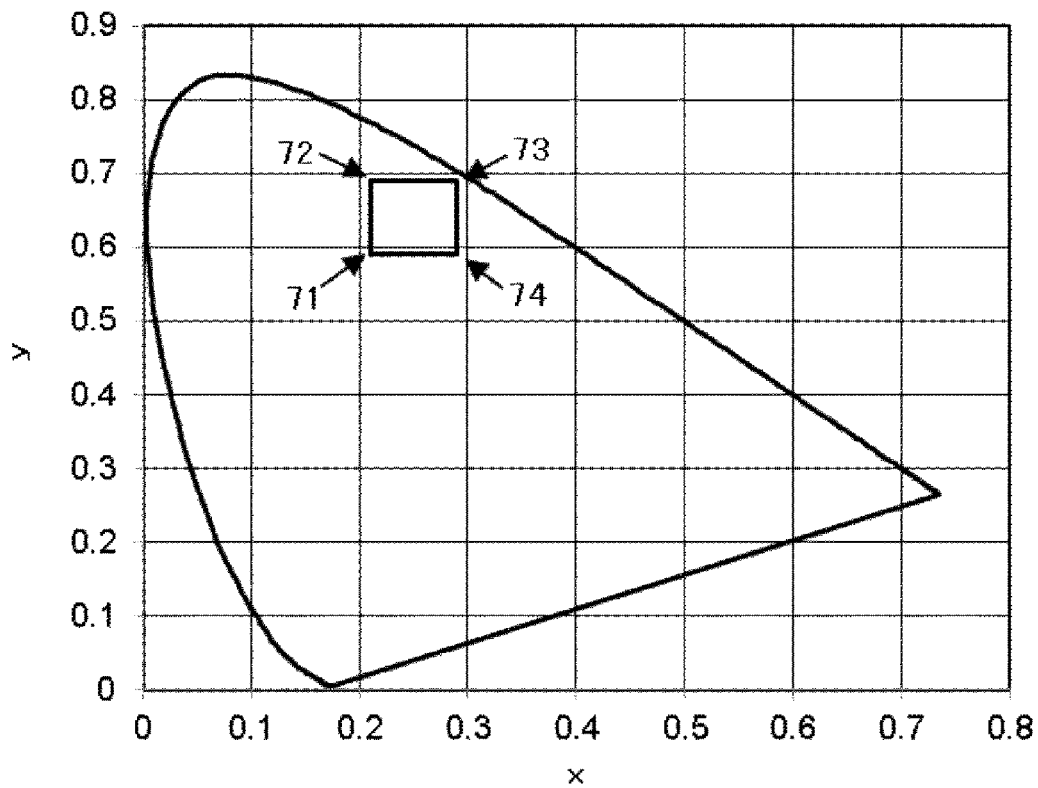
FIG. 3 is a graph showing the chromaticity of the light emitting device on the 1931CIE chromaticity diagram.

As shown in FIG. 3, the chromaticity of the light emitting device 100, for example, on the 1931CIE chromaticity diagram, is preferably positioned in a region enclosed by a first point 71, a second point 72, a third point 73, and a fourth point 74. The first point 71 has x, y coordinates of (0.21, 0.59), the second point 72 has x, y coordinates of (0.21, 0.69), the third point 73 has x, y coordinates of (0.29, 0.69), and the fourth point 74 has x, y coordinates of (0.29, 0.59). This can make the excitation purity of the light emitting device higher.

Figure 4A:
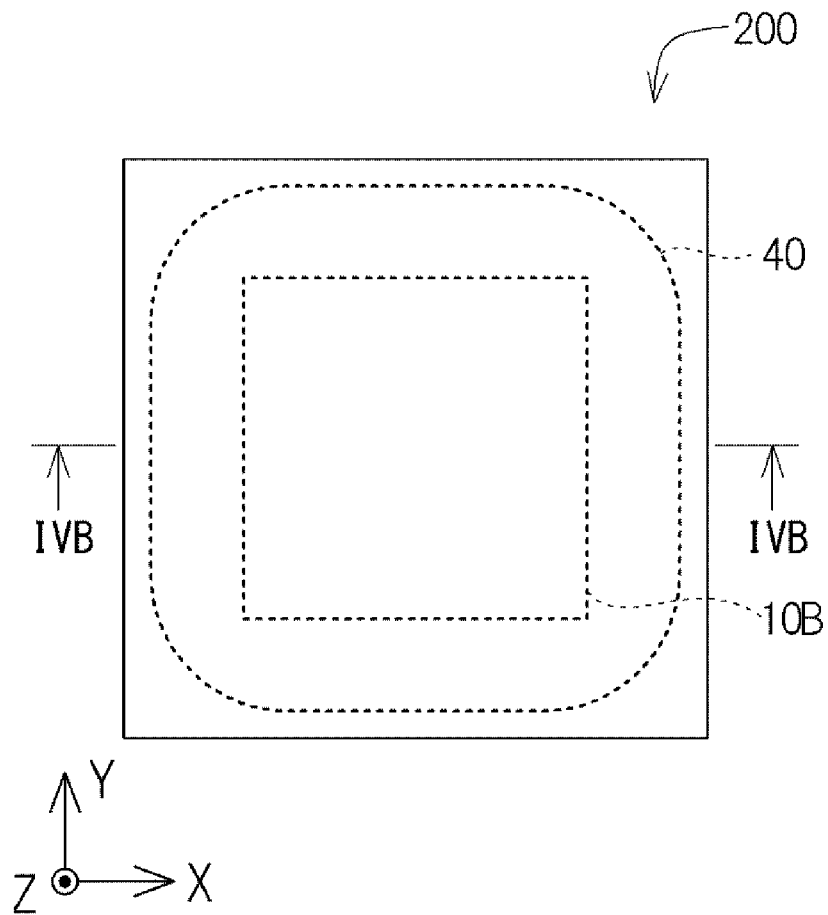
FIG. 4A is a schematic top view of the light emit mg device of an embodiment.
Figure 4B:
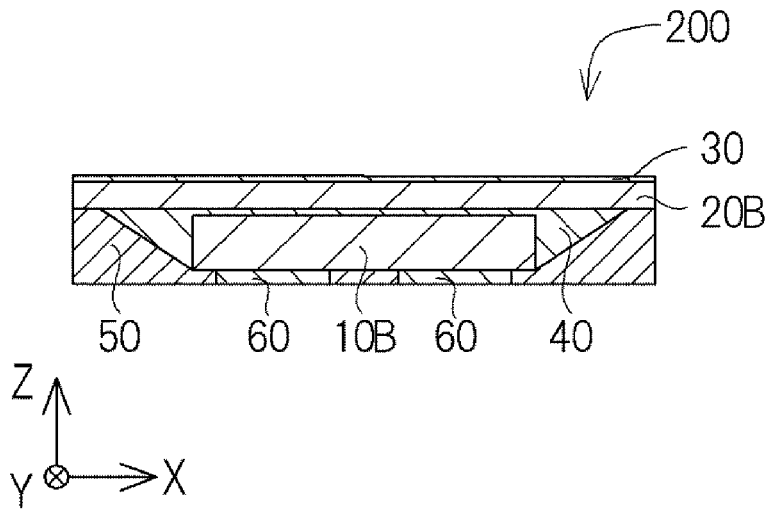
FIG. 4B is a schematic end view taken along line IVB-IVB in FIG. 4A.
Figure 5A:
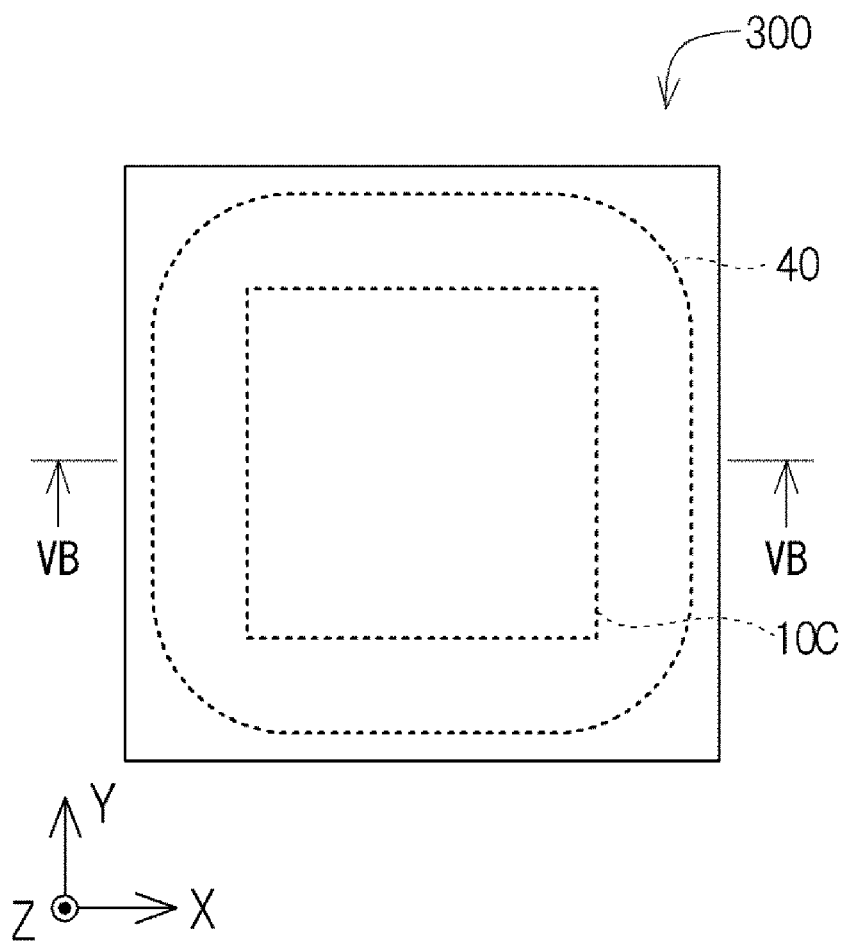
FIG. 5A is a schematic top view of the light emitting device of an embodiment.
Figure 5B:
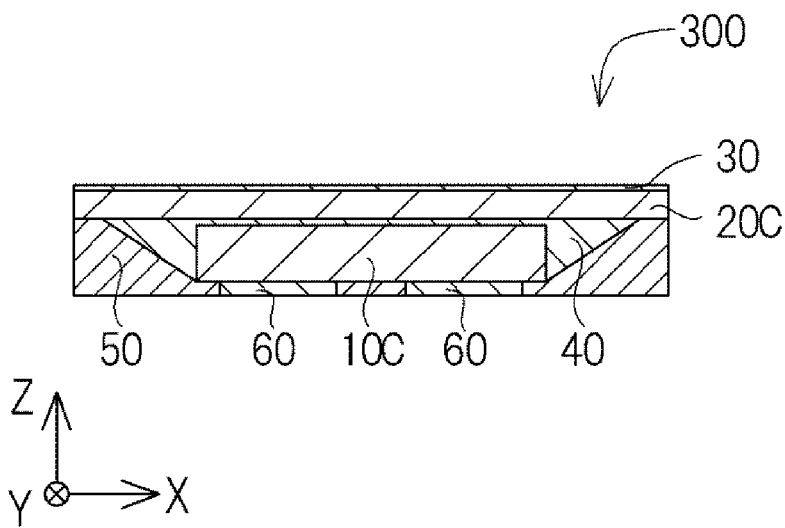
FIG. 5B is a schematic end view taken along line VB-VB in FIG. 5A.

Subsequently, explanation is given of a second light emitting device 200 that emits red light, and a third light emitting device 300 that emits blue light. FIG. 4A is a schematic top view of the second light emitting device 200 of an embodiment, and FIG. 4B is a schematic end view of line IVB-IVB in FIG. 4A. FIG. 5A is a schematic top view of the third light emitting device 300 of an embodiment, and FIG. 5B is a schematic end view of line VB-VB in FIG. 5A. The light emitting device 100 shown in FIG. 1A and FIG. 1B may also be called the first fight emitting device.

The second light emitting device 200 comprises: a second light emitting element 10B emitting light having the peak emission wavelength is in the range of 430 nm or greater, and less than 490 nm; and a second covering member 20B that covers the second light emitting element 10B, and contains a second phosphor emitting light having the peak emission wavelength is in the range of 580 nm to 680 nm. Also, the third light emitting device 300 comprises: a third light emitting element 10C emitting light having the peak emission wavelength is in the range of 430 nm or greater and less than 490 nm; and a third covering member 20C that covers the third light emitting element 10C, and contain substantially no phosphor. "Contain no phosphor" means not excluding phosphors that are unavoidably mixed in, and the content rate of the phosphor is preferably 0.05 weight % or less. The first light emitting element, the second light emitting element, and the third light emitting element may also be called "the light emitting elements." Also, the first covering member, the second covering member, and the third covering member may also be called "the covering members."

The second light emitting device 200, the same as the first light emitting device 100, further comprises the light guide member 40 that covers the lateral surface of the second light emitting element 10B; the reflective member 50 that covers the lateral surface of the second light emitting element 10B with the light guide member 40 interposed; and external terminals 60. The third light emitting device 300, the same as the first light emitting device 100 and the second light emitting device 200, further comprises the light guide member 40, the reflective member 50, and external terminals 60. Also, the second light emitting element 10B and the third light emitting element 10C, the same as the first light emitting element 10A, is a light emitting element that emits blue light having the peak emission wavelength in the range of 430 nm or greater and less than 490 nm. The second light emitting element 10B and the third light emitting element 10C emit light having the peak emission wavelengths at a longer wavelength than the near ultraviolet region, to thereby alleviate degradation of the constituent members of the light emitting device.

The second light emitting device 200 and the third light emitting device 300 can have substantially the same shape as the first light emitting device 100. In other words, the thicknesses and widths of the second light emitting device 200 and the third light emitting device 300 can be equivalent to those of the first light omitting device 100. This, for example, can change the first light emitting device 100 mounted on the light source device to the second light emitting device 200 or the third light emitting device 300, and easier to design the light source device that does the desired light emission.

The second light emitting device 200 comprises the second covering member 20B that contains the second phosphor emitting light having the peak emission wavelength in, the range of 580 nm to 680 nm. The second phosphor may contain primary particles and secondary particles in the same manner as the first phosphor described above. The second covering member 20B covers the second light emitting element 10B. The second covering member 20B is configured with a resin material (such as silicone) containing the second phosphor.

The second phosphor is a red phosphor that absorbs blue light emitted by the second light emitting element 10B, and emits red light. As the second phosphor, it is preferable to use a phosphor having a composition represented by (Sr, Ca)AlSiN$_3$:Eu. The phosphor having the composition represented by (Sr, Ca)AlSiN$_3$:Eu has a full-width-at-half maximum in the light emission spectrum at 125 nm or less, to thereby improve the color purity of the second light emitting device 200. Also, the phosphor of (Sr, Ca)AlSiN$_3$:Eu has shorter afterglow time compared to a phosphor such as K$_2$SiF$_6$:Mn$^{4+}$, etc., for example, thus an afterimage, etc. is less likely to occur on the display device.

The content amount of the second phosphor in the second covering member 20B is preferably 50 weight % or greater with respect to the total weight of the second covering member. By setting the content amount of the second phosphor in the second covering member 20B at 50 weight % or greater can increase the ratio of the red component with respect to the blue component in the light emission spectrum of the second light emitting device 200.

Figure 6:
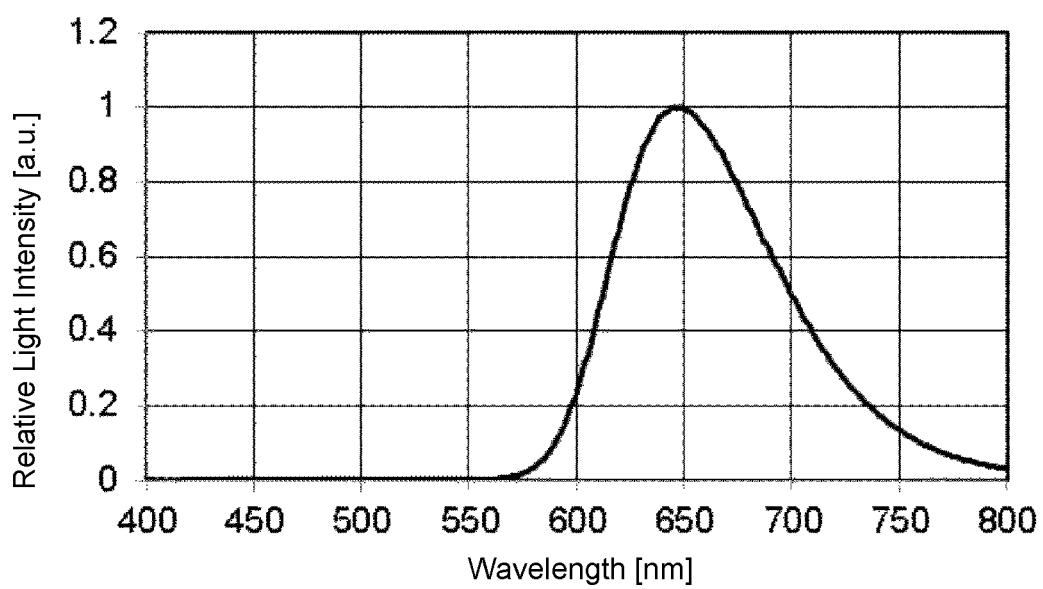
FIG. 6 is a graph showing the light emission spectrum of the light emitting device.

FIG. 6 is a graph showing a light emission spectrum of the second light emitting device 200.

The second light emitting element 10B and the second phosphor are configured to have desired light emission peak intensities such that, in the light emission spectrum of the second light emitting device 200 shown in FIG. 6, the light emissing peak intensity of the second light emitting element 10B is preferably 0.0005 times to 0.01 times the light emission peak intensity of the second phosphor. The light emission peak intensity of the second light emitting element being 0.0005 times or greater than the light emission peak intensity of the second phosphor can make the light output of the light emitting device higher. Also, the light emission peak intensity of the second light emitting element being 0.01 times or less than the light emission peak intensity of the second phosphor can make the excitation purity of the red light higher. Such settings can increase the light output of the second light emitting device 200, and make the excitation purity of the red light of the second light emitting device 200 higher.

In the second light emitting device 200, the excitation purity with respect to red light is, for example, 85% or greater, preferably 90% or greater, and more preferably 95% or greater. Thus, the light source that incorporates the second light emitting device 200 can achieve improved color rendering properties in the red region.

The third light emitting device 300 comprises the third covering member 20C that contain substantially no phosphor. The third covering member 20C covers the third light emitting element 10C. The third covering member 20C is configured with a cured resin material (such as silicone). The third light emitting device 300 comprise no phosphor, so with the blue light of the third light emitting element 10C as the light source, to thereby achieve a light emitting device that emits blue light. In the third light emitting device 300, the excitation purity with respect to blue light is, for example, 85% or greater, preferably 90% or greater, and more preferably 95% or greater. This can achieve improved color rendering properties of the light source that incorporates the third light emitting device 300.

The excitation purity of the first light emitting device 100 with respect to green light is for example, preferably lower than the excitation purity of the second light, emitting device 200 with respect to red light, and the excitation purity of the third light emitting device 300 with respect to blue light. This can make the light output of the first light emitting device 100 higher.

Figure 7:
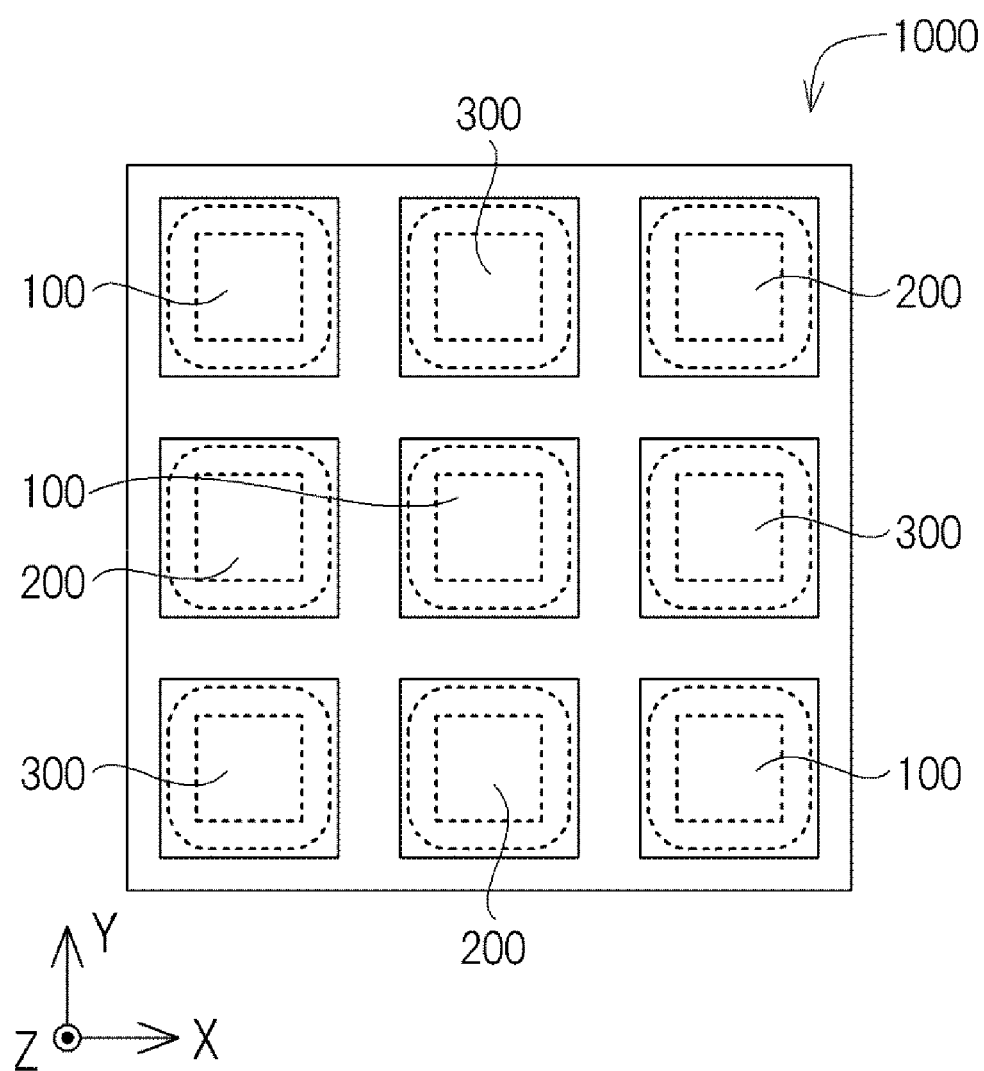
FIG. 7 is a top view of the light source device of an embodiment.

A light source device 1000 shown in FIG. 7 is explained.

The light source device 1000 comprises first light emitting devices 100, second light emitting devices 200, and third light emitting devices 300. With the light source device 1000, seen in the top view, the second light emitting devices 200 or the third light emitting devices 300 are positioned in the vertical and horizontal directions of the first light emitting devices 100. This can alleviate color non-uniformity of the light source device 1000.

Following, a detailed explanation is given of each member used in the first light emitting device 100, the second light emitting device 200, the third light emitting device. 300, and the light source device 1000 of the present disclosure.

Light Emitting Element

The first light emitting element 10A, the second light emitting element 10B, and the third light emitting element 10C function as light sources of the light emitting device. For the light emitting elements, it is possible to use light emitting diode elements, etc., and it is possible to suitably use a nitride semiconductor capable of light emission in the visible region ($In_xAl_yGa_{1-x-y}N$, $0 \leq x$, $0 \leq y$, $x+y \leq 1$).

The first light emitting element 10A, the second light emitting element 10B, and the third light cunning element 10C are light emitting elements that emit blue light having the peak emission wavelength is in the range of 490 nm to 570 nm. Each light emitting element preferably uses the light emitting element that emits light having the full-width-at-half maximum is 40 nm or less, and more preferably uses the light emitting element that emits light having the full-width-at-half maximum is 30 nm or less. Thus, for example, in the first light emitting device 100 or the second light emitting device 200, even in a case when a blue component remains in the light emission spectrum, the integral value of that blue component can be smaller, and the excitation purity of green or red can be higher.

The first light emitting device 100, the second light emitting device 200, and the third light emitting device 300 each comprise one light emitting element which has a rectangular shape seen in the top view. The shape of the light emitting device of the present disclosure is not limited to this. For the first, light emitting device 100, the second light emitting device 200, and the third light emitting device 300, it is possible to change the planar shape of the light emitting element, the number of the light emitting elements, and the arrangement of the light emitting elements, etc., according to the purpose and application.

First Covering Member, First Phosphor

The first light emitting device 100 comprises the first covering member 20A containing the first phosphor 21A that converts the wavelength of light from the first light emitting element 10A. The first phosphor 21A emits light having the peak emission wavelength in the range of 490 nm to 570 nm. For example, the first covering member 20A can be configured with the first base material 22A (such as silicone) contains the first phosphor 21A, and be formed using a material comprising resin, glass, or ceramic in a sheet shape or block shape. The first covering member 20A can be formed using printing, the electrophoretic deposition method, potting, or a spray method, etc. of the resin material. The first covering member 20A can be formed by printing the resin material, on a transmissive member such as glass. When printing the resin material on the transmissive member, the printed resin material is referred to as the first covering member 20A.

As the resin material of the first base material 22A, thermosetting resin or thermoplastic resin, etc. can be used. Specific examples include silicone resin, epoxy resin, acrylic resin, or a combined resin containing at least one of these. Also, in the first covering member 20A light scattering particles such as titanium oxide, silicon oxide, zirconium oxide, aluminum oxide, etc. can be scattered in addition to the first phosphor 21A. The shape of the light scattering particles can be any of a crushed shape, spherical shape, hollow, or porous, etc.

Examples of the first phosphor 21A include a phosphor such as $(Ca, Sr, Ba)_8MgSi_4O_{16}(F, Cl, Br)_2$:Eu, $Si_{6-z}Al_zO_zH_{8-z}$:Eu ($0<z<4.2$), $Ba_3Si_6O_{12}N_2$:Eu, etc. In particular, a phosphor such as $(Ca, Sr, Ba)_8MgSi_4O_{16}(F, Cl, Br)_2$:Eu can be suitably used.

The first covering member 20A can comprise another phosphor in addition to the first phosphor 21A. As another phosphor, for example, it is possible to use a phosphor such as $(Ca, Sr, Ba)_5(PO_4)_3(Cl, Br)$:Eu, $Si_{6-x}Al_zO_zN_{8-z}$:Eu $0<z<4.2$), $(Sr, Ca, Ba)_4Al_{14}O_{25}$:Eu $(Ca, Sr, Ba)_8MgSi_4O_{16}$ $(F, Cl, Br)_2$:Eu, $(Y, Lu, Gd)_3(Al, Ga)_5O_{12}$:Ce, $Ca_3Sc_2Si_3O_{12}$:Ce, $CaSc_2O_4$:Ce.

Second Covering Member, Second Phosphor

The second coveting member 20B can be configured using the same resin material and light scattering particles, etc., as the first covering member 20A as appropriate. The second covering member 20B contains the second phosphor that converts the wavelength of light from the second light emitting element 10B.

As the second phosphor, for example, it is possible to use a phosphor such as $(Sr, Ca)AlSiN_3$:Eu, $CaAlSiN_3$:Eu, $K_2SiF_6$:$Mn^{4+}$, $3.5MgO.0.0.5MgF_2.GeO_2$:$Mn^{4+}$, etc. In particular, it is possible to preferably use $(Sr, Ca)AlSiN_3$:Eu phosphor.

Third Covering Member

The third covering member 20C is configured using the same resin material, light scattering particles, etc., as of the first covering member 20A as appropriate. The third covering member 20C does not contain phosphor.

Light Guide Member 40

The light guide member covers the lateral surface of the light emitting element. A resin material can be used for the light guide member. Example resin materials of the light guide member include a thermosetting resin, a thermoplastic resin. Specific examples include silicone resin, epoxy resin, acrylic resin, or a resin containing one or more of these. Also, the light guide member may contain the same light scattering particles as the first covering member 20A. The light guide member may also be omitted.

Reflective Member 50

The reflective member preferably has the light reflectance of 70% or greater, more preferably 80% or greater, and even more preferably 90% or greater, with respect to the peak emission wavelength of the light emitting element. Furthermore, the reflective member is preferably a white color. Thus, the reflective member preferably contains a white pigment in the base material. The reflective member can be formed using transfer molding, injection molding, compression molding, potting, etc.

Base Material of the Reflective Member

The base material of the reflective member can be formed using resin such as silicone resin, epoxy resin, acrylic resin, or a combined resin containing at least one of these. Among these, silicone resin and modified silicone resin are preferable because they have good heat resistance and good light resistance. Specific Silicone resin examples include dimethyl silicone resin, phenyl methyl silicone resin, and diphenyl silicone resin.

White Pigment

The white pigment can be formed using titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide, either as one type alone, or in a combination or two or more of these. The shape of the white pigment can be selected as appropriate, and an irregular shape or crushed shape can be used, but from the perspective of fluidity, a spherical shape is preferable. Also, the particle diameter of the white pigment can be approximately 0.1 μm to 0.5 μm, for example, but the smaller the more preferable to enhance the light reflection and effect of covering. The content amount of the white pigment in the reflective member can be selected as appropriate, but from the perspective of light reflectance and viscosity in liquid state, etc., for example, 10 wt % to 80 wt % is preferable, 20 wt % to 70 wt % is more preferable, and 30 wt % to 60 wt % is even more preferable. The unit "wt %" refers the weight percent, and represents the ratio of the weight of the objected material with respect to the total weight of the reflective member.

Outermost Layer 30

The surface of the outermost layer constitutes a portion of the outer surface of the light emitting device. The outermost layer contains a resin and a filler. Examples of the resin forming the outermost layer include at least one of silicone resin, epoxy resin, phenol resin, polycarbonate resin, acrylic resin, TPX resin, polynorbornene resin, as well as modified resins and hybrid resins of these. As the silicone type resin, it is possible to use at least one of dimethyl silicone resin, phenyl methyl silicone resin, diphenyl silicone resin, as well as modified resin and hybrid resin of these. The filler of the outermost layer can be an inorganic substance or an organic substance. Specifically, silica, bentonite, stearic acid amide, etc. can be used. Among these, silica is preferable from the perspective of translucency.

External Connection Terminal 60

The external connection terminal can be a projecting electrode (e.g., bump or pillar), a lead electrode (e.g., singulated lead frame), and can also serve as the positive and negative electrodes of the light emitting element. The external connection terminal can be configured by small pieces of metal or alloy. Specific examples include gold, silver, copper, iron, tin, platinum, zinc, nickel, aluminum, tungsten, and alloys of these. Among these, copper has good heat conductivity, and is relatively inexpensive, so copper or a copper alloy are particularly suitable. Also, gold is also chemically stable and has the properties having little surface oxidation and bonding easily, so gold or a gold alloy are also preferable. The external connection terminal can have a coating such as gold or silver, etc. on the surface from the perspective of solder bondability.

What is claimed is:

1. A light emitting device comprising:
   a first light emitting element having a peak emission wavelength in a range of 430 nm or greater and less than 490 nm; and
   a first covering member covering the first light emitting element, and containing a first phosphor having a peak emission wavelength in a range of 490 nm or greater and 570 nm or less, the first phosphor containing secondary particles, wherein
   a mixed color light in which light emitted from the first light emitting element and light emitted from the first phosphor are mixed has an excitation purity of 60% or greater on a 1931CIE chromaticity diagram,
   in the light emission spectrum of the light emitting device, the light emission peak intensity of the first light emitting element is 0.01 times to 0.03 times of the light emission peak intensity of the first phosphor,
   on the 1931CIE chromaticity diagram, a chromaticity of the light emitting device is positioned in an area surrounded by a first point, a second point, a third point, and a fourth point, and
   the x, y coordinates of the first point are (0.21, 0.59), the x, y coordinates of the second point are (0.21, 0.69), the x, y coordinates of the third point are (0.29, 0.69), and the x, y coordinates of the fourth point are (0.29, 0.59).

2. The light emitting device according to claim 1, wherein a median particle diameter of the first phosphor is 1.5 times to 3 times of an average particle diameter of the first phosphor.

3. The light emitting device according to claim 1, wherein the first phosphor has a composition represented by $(Ca, Sr, Ba)_8MgSi_4O_{16}(F, Cl, Br)_2:Eu$.

4. The light emitting device according to claim 1, further comprising
   a reflective member covering a lateral surface of the light emitting element, wherein
   the first covering member covers the light emitting element and the reflective member.

5. The light emitting device according to claim 1, further comprising
   an outermost layer covering the first covering member, wherein
   a top surface of the outermost layer has recesses and projections.

6. A light source device comprising:
   a first light emitting device which is the light emitting device of claim 1;
   a second light emitting device comprising
      a second light emitting element having a peak emission wavelength in a range of 430 nm or greater and less than 490 nm, and
      a second covering member covering the second light emitting element, and containing a second phosphor which emits light having a peak emission wavelength in a range of 580 nm to 680 nm; and
   a third light emitting device comprising
      a third light emitting element having a peak emission wavelength in a range of 430 nm or greater and less than 490 nm, and
      a third covering member covering the third light emitting element.

7. The light source device according to claim 6, wherein
a content of the second phosphor is 50 weight % or greater with respect to a total weight of the second covering member.

8. The light source device according to claim 6, wherein
the excitation purity of the first light emitting device is lower than an excitation purity of the second light emitting device or an excitation purity of the third light emitting device.

9. The light source device according to claim 6, wherein
in the light emission spectrum of the second light emitting device, a light emission peak intensity of the second light emitting element is 0.0005 times to 0.01 times of a light emission peak intensity of the second phosphor.

10. The light source device according to claim 6, wherein
the second phosphor has a composition represented by (Sr, Ca)AlSiN$_3$:Eu.

11. The light emitting device according to claim 1, wherein
a content of the first phosphor is 50 weight % or greater with respect to a total weight of the first covering member.

12. The light emitting device according to claim 1, wherein
the first covering member has a sheet shape or a block shape.

13. The light emitting device according to claim 1, wherein
the first coating member includes a base material selected from a group consisting of a resin material, glass and ceramic.

14. The light emitting device according to claim 1, wherein
the first coating member includes a translucent member and a resin material printed on the translucent member.

* * * * *